US010720391B1

(12) United States Patent
Paul et al.

(10) Patent No.: US 10,720,391 B1
(45) Date of Patent: Jul. 21, 2020

(54) METHOD OF FORMING A BURIED INTERCONNECT AND THE RESULTING DEVICES

(71) Applicant: GLOBALFOUNDRIES Inc., Grand Cayman (KY)

(72) Inventors: Bipul C. Paul, Mechanicville, NY (US); Lars W. Liebmann, Mechanicville, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/240,335

(22) Filed: Jan. 4, 2019

(51) Int. Cl.
| H01L 23/00 | (2006.01) |
| H01L 23/535 | (2006.01) |
| H01L 21/308 | (2006.01) |
| H01L 21/306 | (2006.01) |
| H01L 21/8234 | (2006.01) |
| H01L 21/768 | (2006.01) |
| H01L 29/06 | (2006.01) |
| H01L 27/088 | (2006.01) |
| H01L 29/08 | (2006.01) |
| H01L 27/11 | (2006.01) |
| H01L 21/02 | (2006.01) |
| H01L 29/66 | (2006.01) |

(52) U.S. Cl.
CPC .......... *H01L 23/535* (2013.01); *H01L 21/308* (2013.01); *H01L 21/30604* (2013.01); *H01L 21/76831* (2013.01); *H01L 21/823418* (2013.01); *H01L 21/823431* (2013.01); *H01L 21/823475* (2013.01); *H01L 21/823481* (2013.01); *H01L 27/0886* (2013.01); *H01L 29/0669* (2013.01); *H01L 29/0847* (2013.01); *H01L 21/0217* (2013.01); *H01L 21/0228* (2013.01); *H01L 21/02274* (2013.01); *H01L 27/1104* (2013.01); *H01L 29/66545* (2013.01)

(58) Field of Classification Search
CPC .................................................. H01L 29/785
See application file for complete search history.

(56) References Cited

U.S. PATENT DOCUMENTS

| 7,002,187 B1 | 2/2006 | Husher |
| 9,570,395 B1 | 2/2017 | Sengupta et al. |
| 9,793,273 B2 * | 10/2017 | Liaw ................. H01L 21/28088 |

(Continued)

*Primary Examiner* — Caridad Everhart
*Assistant Examiner* — Ankush K Singal
(74) *Attorney, Agent, or Firm* — Amerson Law Firm, PLLC

(57) ABSTRACT

A method of forming a buried local interconnect is disclosed including, among other things, forming a first sacrificial layer embedded between a first semiconductor layer and a second semiconductor layer, forming a plurality of fin structures above the second semiconductor layer, forming a mask layer having an opening positioned between an adjacent pair of the fin structures, removing a portion of the second semiconductor layer exposed by the opening to expose the first sacrificial layer and define a first cavity in the second semiconductor layer, removing portions of the first sacrificial layer positioned between the first semiconductor layer and the second semiconductor layer to form lateral cavity extensions of the first cavity, forming a first liner layer in the first cavity, and forming a conductive interconnect in the first cavity over the first liner layer.

16 Claims, 21 Drawing Sheets

View X2-X2

(56) References Cited

U.S. PATENT DOCUMENTS

| | | | |
|---|---|---|---|
| 2001/0053599 A1* | 12/2001 | Pyo | H01L 21/28562 |
| | | | 438/618 |
| 2003/0094654 A1 | 5/2003 | Christensen et al. | |
| 2007/0279842 A1* | 12/2007 | Ishida | B60R 16/0239 |
| | | | 361/600 |
| 2014/0264754 A1* | 9/2014 | Surthi | H01L 21/2257 |
| | | | 257/607 |
| 2017/0062421 A1 | 3/2017 | Cosemans et al. | |
| 2018/0145030 A1 | 5/2018 | Beyne et al. | |
| 2020/0027777 A1* | 1/2020 | Sung | H01L 21/31116 |

\* cited by examiner

METHOD OF FORMING A BURIED INTERCONNECT AND THE RESULTING DEVICES

BACKGROUND

1. Field of the Disclosure

The present disclosure generally relates to the fabrication of semiconductor devices, and, more particularly, to various embodiments of a method of forming a buried local interconnect and the resulting devices.

2. Description of the Related Art

In general, memory devices are the means by which electronic information is stored. There are many types of memory devices, e.g., SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., cache memory of a microprocessor, mobile phones and other mobile consumer products, etc. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Read/write circuitry is used to access the memory device to store digital information on such a memory device and to determine whether or not a charge is presently stored in the memory device. These read/write cycles typically occur millions of times for a single memory device over its effective lifetime.

In manufacturing memory devices, such as an SRAM cell, various interconnect structures are formed to connect the elements of the cell. For example, a conductive contact structure is formed to cross-couple (or conductively couple) a shared drain region on a first inverter with a gate structure of the second inverter, and to cross-couple a shared drain region on the second inverter with a gate structure of the first inverter. Other interconnections are required to connect power supply voltages (e.g., VDD and ground) to the elements of the cell. The area of the semiconductor device needed for routing the interconnect cross-coupling structure limits the scaling of the footprint of the device.

The present disclosure is directed to a method of forming a buried local interconnect in a source/drain region and the resulting devices.

SUMMARY

The following presents a simplified summary of illustrative embodiments of the invention in order to provide a basic understanding of some aspects of the illustrative embodiments of the invention. This summary is not an exhaustive overview of the illustrative embodiments of the invention specifically discussed herein. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of a method of forming a buried local interconnect in a source/drain region and the resulting devices. One illustrative method includes, among other things, forming a first sacrificial layer embedded between a first semiconductor layer and a second semiconductor layer, forming a plurality of fin structures above the second semiconductor layer, forming a mask layer having an opening positioned between an adjacent pair of the fin structures, removing a portion of the second semiconductor layer exposed by the opening to expose the first sacrificial layer and define a first cavity in the second semiconductor layer, removing portions of the first sacrificial layer positioned between the first semiconductor layer and the second semiconductor layer to form lateral cavity extensions of the first cavity, forming a first liner layer in the first cavity, and forming a conductive interconnect in the first cavity over the first liner layer.

An illustrative device includes, among other things, a first fin structure and a second fin structure positioned above a first semiconductor layer, and a conductive interconnect positioned in the semiconductor layer, wherein at least a first portion of the conductive interconnect extends laterally under at least a portion of the first fin structure and a second portion of the conductive interconnect extends laterally under at least a portion of the second fin structure.

Another illustrative devices includes, among other things, a first fin structure and a second fin structure positioned above a first semiconductor layer, wherein the first fin structure comprises a first source/drain region, a conductive interconnect positioned in the semiconductor layer and having a T-shaped vertical cross-section, and a first contact contacting the first source/drain region and the conductive interconnect.

BRIEF DESCRIPTION OF THE DRAWINGS

The disclosure may be understood by reference to the following description taken in conjunction with the accompanying drawings, in which like reference numerals identify like elements, and in which.

Figure 1A:
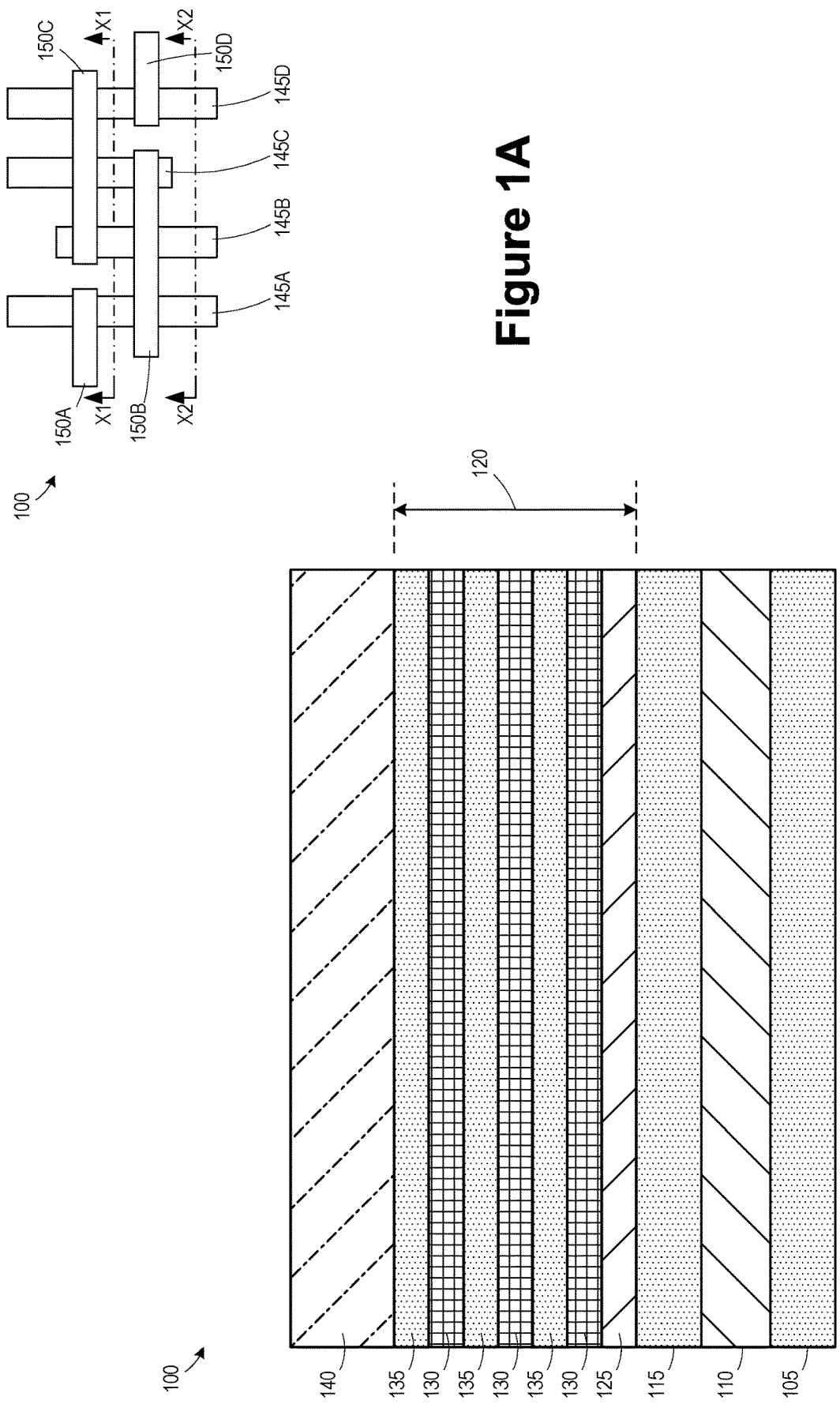
FIGS. 1A-1L are various views that depict methods for forming buried local interconnects and the resulting devices.

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The various layers of material described below may be formed by any of a variety of different known techniques, e.g., a chemical vapor deposition (CVD) process, an atomic layer deposition (ALD) process, a thermal growth process, epitaxial growth processes, spin-coating techniques, etc. Moreover, as used herein and in the attached claims, the word "adjacent" is to be given a broad interpretation and should be construed to cover situations where one feature actually contacts another feature or is in close proximity to that other feature.

FIGS. 1A-1L are various views that depict methods for forming buried local interconnects and the resulting integrated circuit product 100. In some embodiments, the product 100 includes vertically stacked nano-sheet devices. The product 100 is be formed in and above a semiconductor substrate 105. The substrate 105 may have a variety of configurations, such as the depicted bulk configuration. A semiconductor-on-insulator (SOI) configuration that includes a bulk semiconductor layer, a buried insulation layer positioned on the bulk substrate 105 and one or more semiconductor material layers positioned on the buried insulation layer may also be used. The substrate 105 may be made of silicon or it may be made of materials other than silicon, e.g., silicon-germanium, a III-V compound semiconductor material, etc. Thus, the terms "substrate" or "semiconductor substrate" should be understood to cover all semiconducting materials and all forms of such materials.

In some embodiments, the product 100 is formed as part of a high speed logic circuit. The IC product 100 includes a sacrificial layer 110 positioned above the substrate 105 and a semiconductor material layer 115 positioned above the sacrificial layer 110. The sacrificial layer 110 is thus buried between the substrate 105 and the semiconductor material layer 115. In some embodiments, the semiconductor layer 115 is the same material as the substrate 105 (e.g., silicon), so the sacrificial layer 110 can be seen as being buried in the substrate 105.

A nano-sheet stack 120 is formed above the semiconductor layer 115. The nano-sheet stack 120 includes a bottom sacrificial layer 125 and interleaved intermediate sacrificial layers 130 and channel semiconductor layers 135. A hard mask layer 140 is formed above the nano-sheet stack 120. In some embodiments, the channel semiconductor layers 135 include substantially pure silicon. In some embodiments, the intermediate sacrificial layers 130 include silicon-germanium ($Si_xGe_{(1-x)}$ where x ranges from 0.65 to 0.85), and the bottom sacrificial layer 125 includes silicon-germanium ($Si_yGe_{(1-y)}$ where y ranges from 0.25 to 0.5). The thicknesses of the layers 110, 115, 125, 130, 135 may vary depending upon the particular application and they need not have the same thicknesses. The different levels of Ge in the layers 125, 130, 135 provide etch selectivity so that certain layers may be removed selectively.

The drawings include a simplistic plan view of the product 100 indicating where various cross-sectional views "X1-X1" and "X2-X2" are taken. However, no attempt will be made to show the various steps depicted in the cross-sectional views in the drawings in the plan view of the product 100.

Figure 1B:
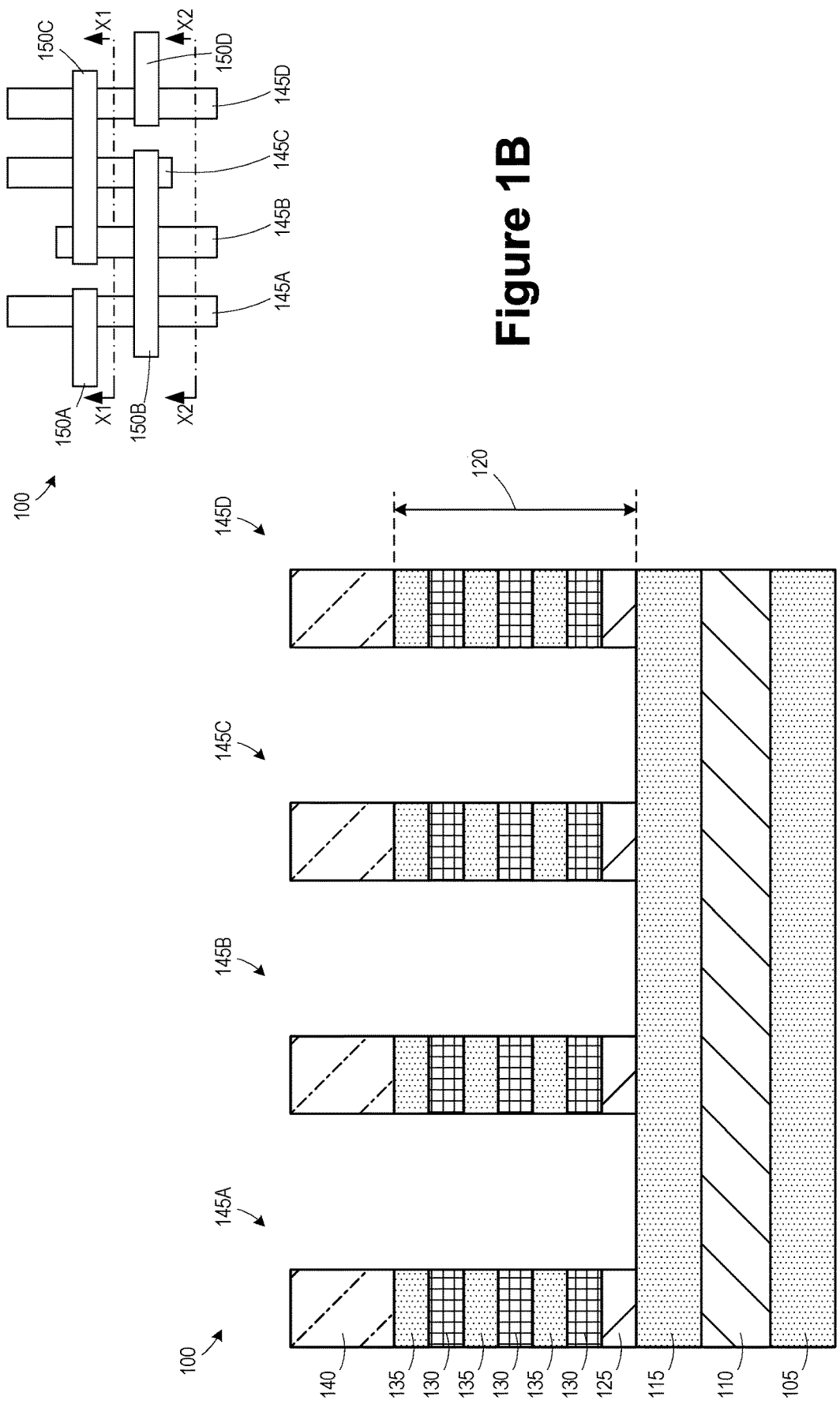

FIG. 1B illustrates the product 100 after the hard mask layer 140 was patterned and used as an etch template to define nano-sheet fins 145A, 145B, 145C, 145D, each having a narrow width compared to its axial length. As seen in the plan view, gate structures 150A, 150B, 150C, 150D were formed above the nano-sheet fins 145A, 145B, 145C, 145D. In some embodiments, the nano-sheet fins 145A, 145B, 145C, 145D and the gate structures 150A, 150B, 150C, 150D define a static random access memory (SRAM) cell. Although the illustrated example depicts nano-sheet fins 145A, 145B, 145C, 145D, the techniques described herein may also be applied to semiconductor fins in some embodiments.

Figure 1C:
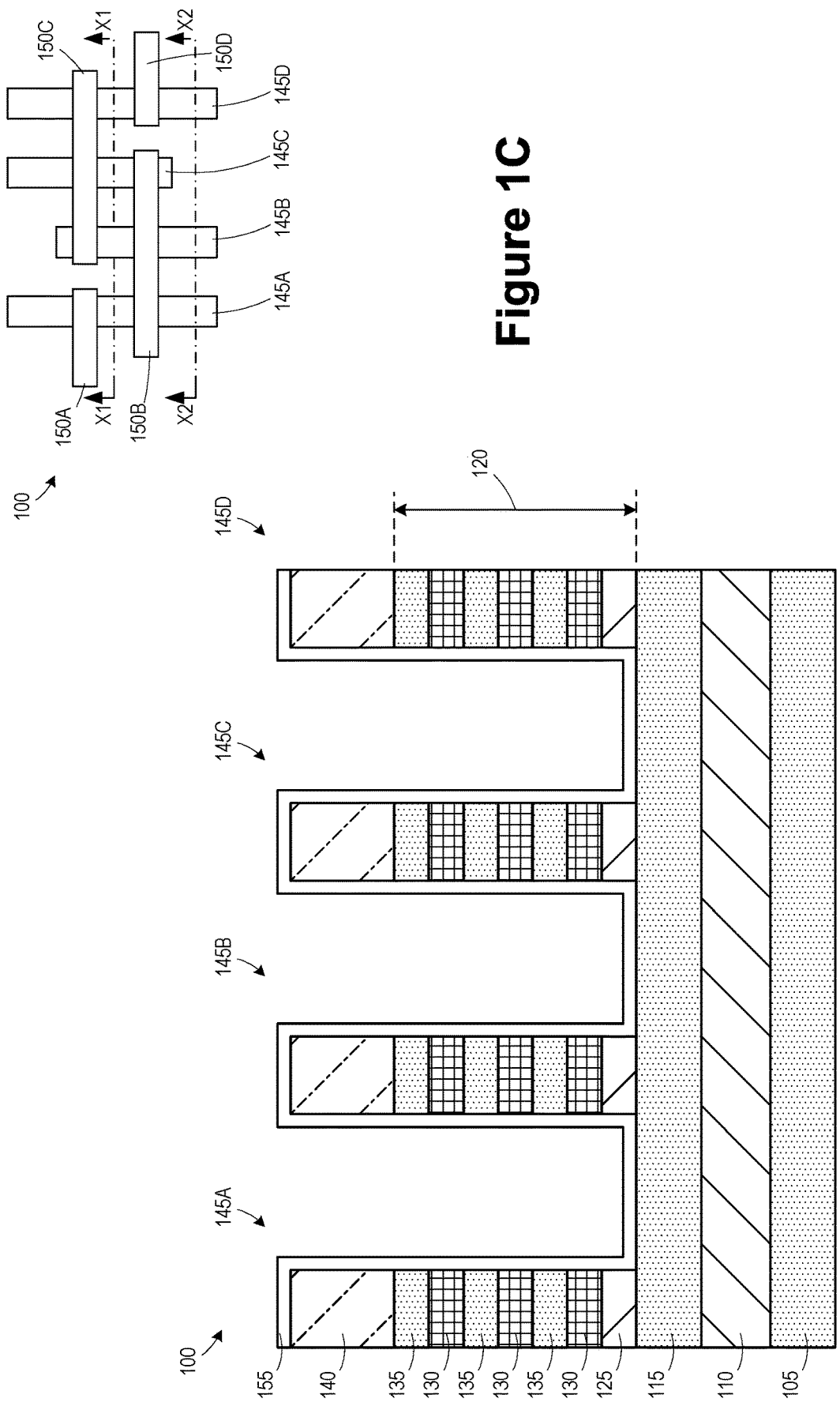

FIG. 1C illustrates the product 100 after a liner layer 155 (e.g., silicon nitride) was formed above the nano-sheet fins 145A, 145B, 145C, 145D.

Figure 1D:
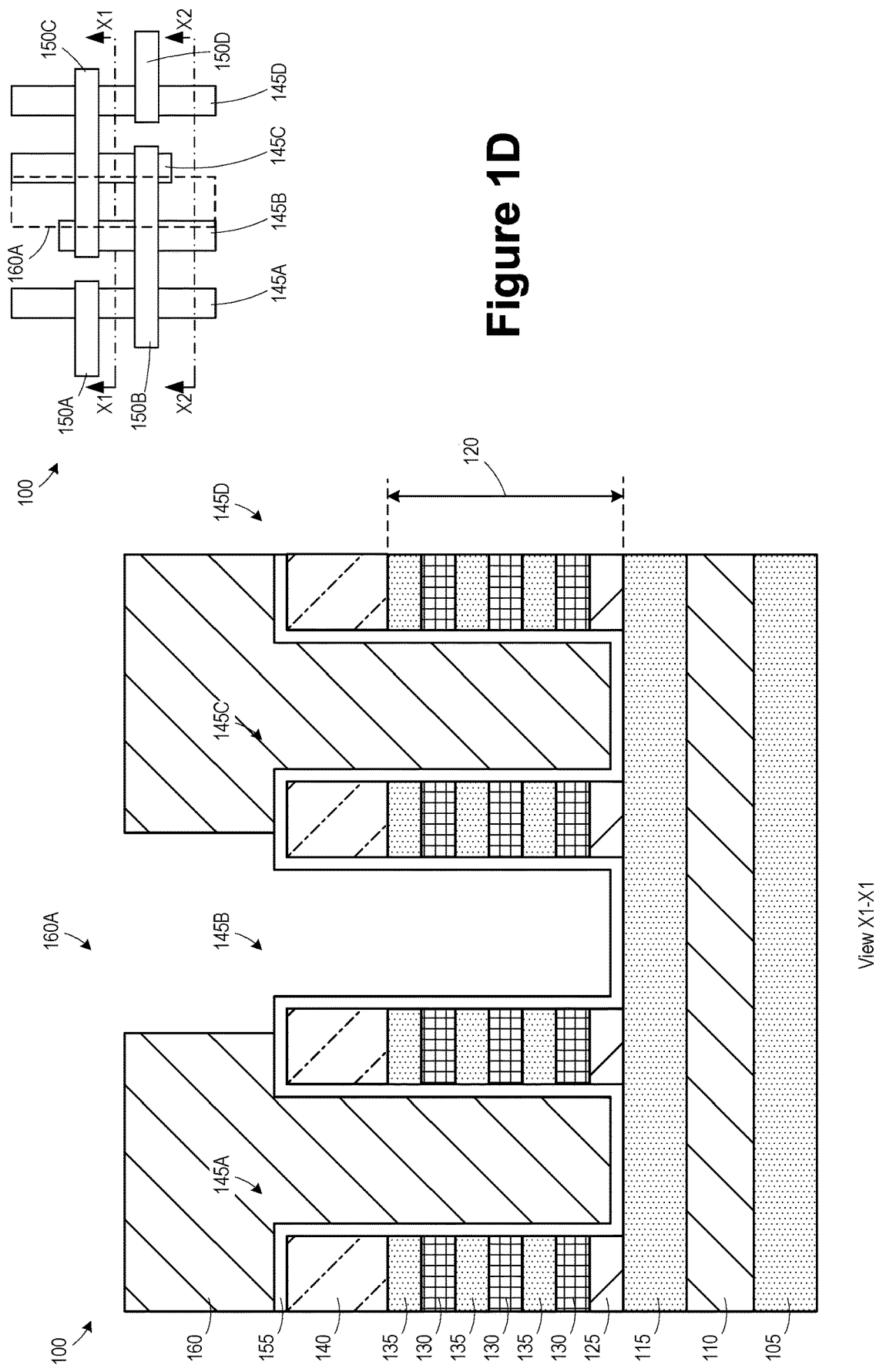

FIG. 1D illustrates the product 100 after a patterned etch mask 160, e.g., a patterned organic patterning layer (OPL) or photoresist, was formed on the product 100 by performing traditional manufacturing techniques. The patterned etch mask 160 includes an opening 160A located between the nano-sheet fins 145B, 145C. As described more fully below, the opening 160A is positioned at a location where it is desired to form a buried interconnect, such as a buried power rail.

Figure 1E:
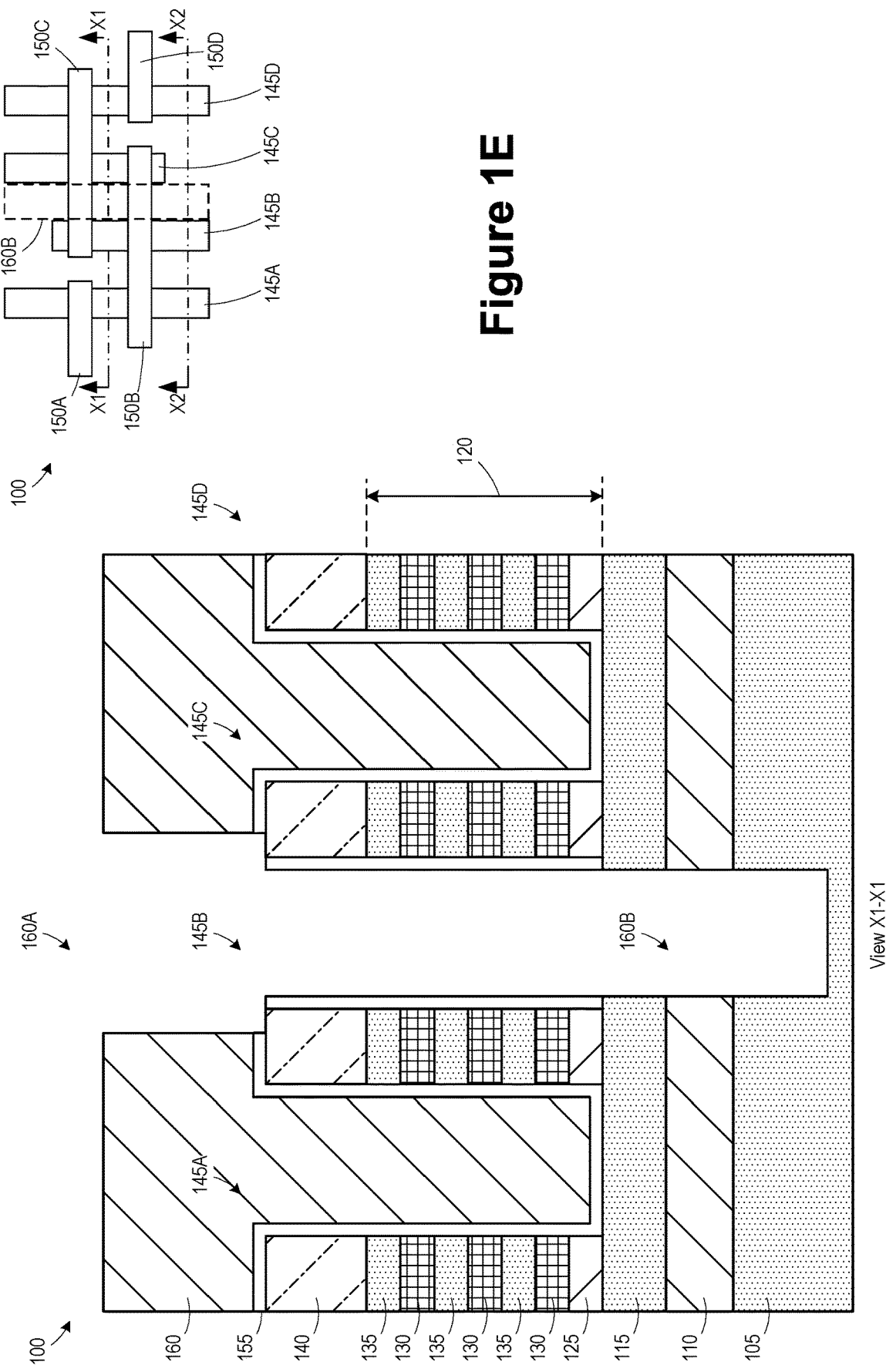

FIG. 1E illustrates the product 100 after one or more etch processes were performed using the patterned etch mask 160 to open the liner layer 155 and remove portions of the semiconductor layer 115 and the sacrificial layer 110 to define a cavity 160B in the semiconductor layer 115 and the sacrificial layer 110. In some embodiments, a portion of the substrate 105 is also removed, such that the cavity 160B extends into the substrate 105.

Figure 1F:
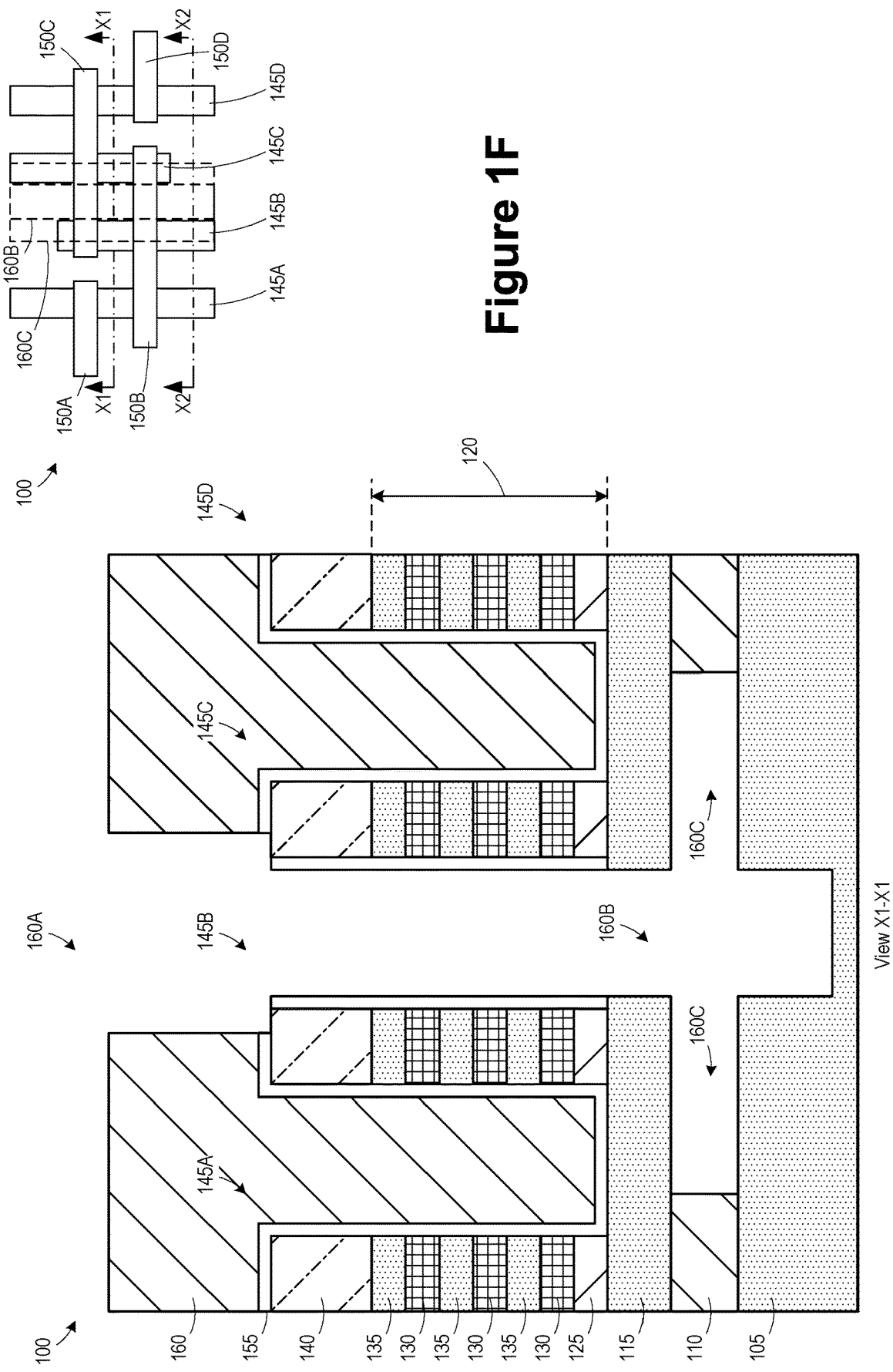

FIG. 1F illustrates the product 100 after a selective etch process was performed to remove lateral portions of the sacrificial layer 110 to extend the cavity 160B laterally in a region positioned between the semiconductor layer 115 and the substrate 105 to define lateral cavity extensions 160C.

Figure 1G:
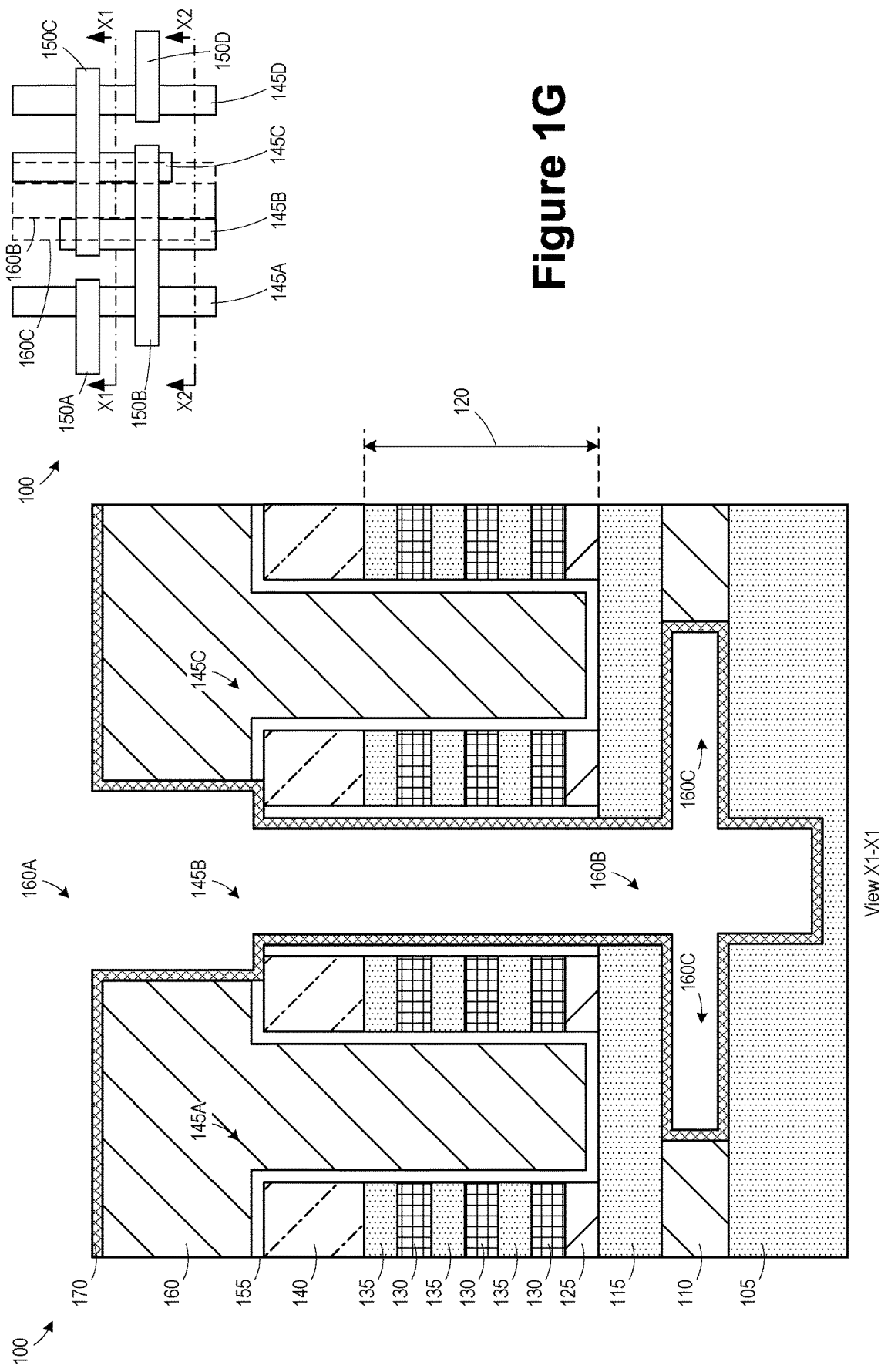

FIG. 1G illustrates the product 100 after a deposition process (e.g., plasma-enhanced atomic layer deposition (PEALD)) was performed to form a liner layer 170 (e.g., silicon nitride) in the cavities 160B, 160C.

Figure 1H:
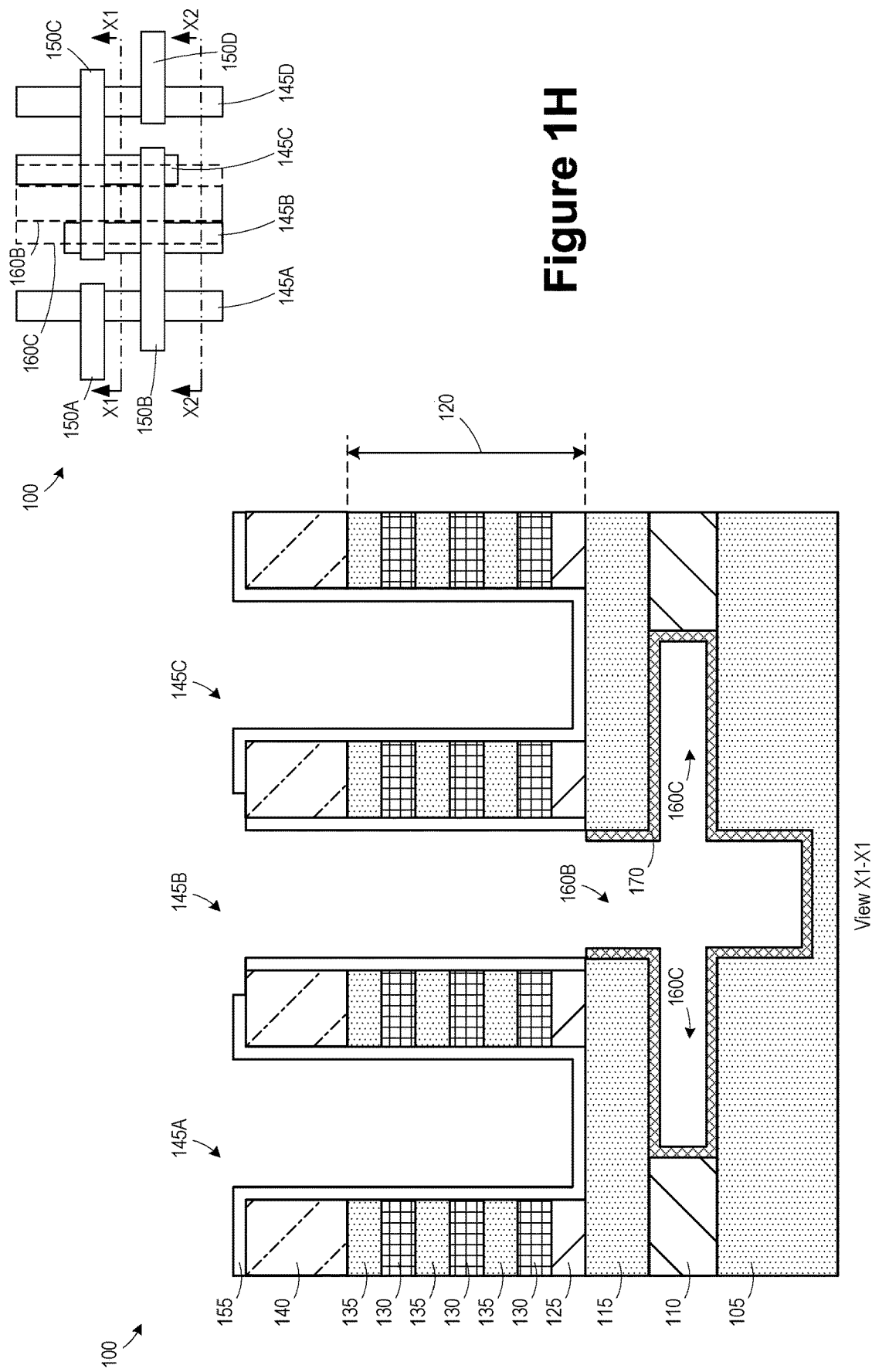

FIG. 1H illustrates the product 100 after a chamfering process was performed to remove upper portions of the liner layer 170 positioned above the patterned etch mask 160 and on sidewalls of the nano-sheet fins 145B, 145C, and the patterned etch mask 160 was removed. During a chamfering process, a sacrificial material is provided to partially fill the cavities such that it exposes portions of the liner layer 170 disposed on sidewalls of the nano-sheet fins 145B, 145C. An etch process is performed to remove these exposed portions of the liner layer 170, and the sacrificial material is removed. The remaining portion of the liner layer 170 in cavities 160B, 160C lines the bottom portion of the gate cavity, thereby decreasing the aspect ratio of the upper portion for subsequent material depositions within the gate cavities.

Figure 1I:
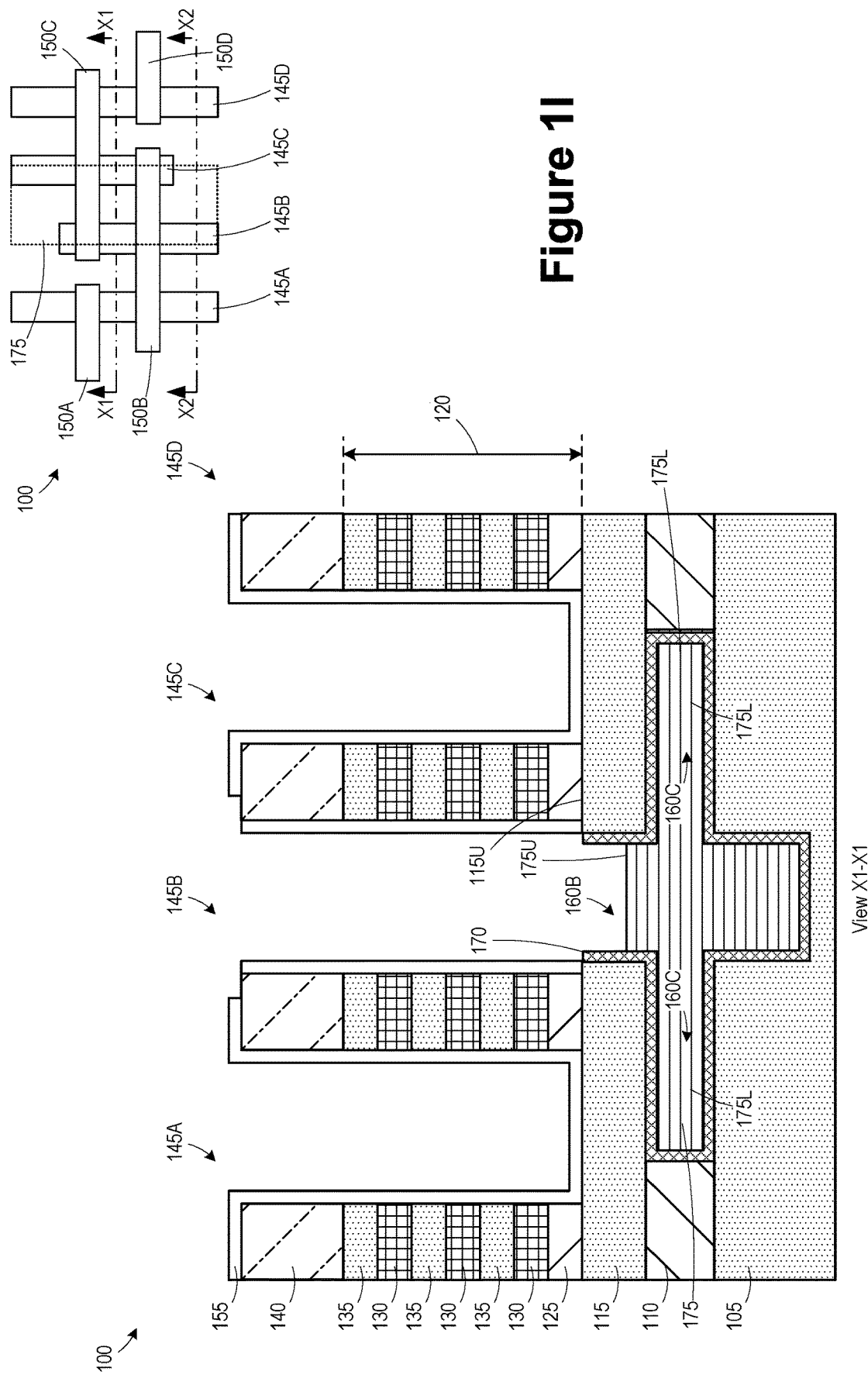

FIG. 1I illustrates the product 100 after several processes were performed to form a conductive interconnect 175 in the cavities 160B, 160C. A deposition process was performed to form a conductive material (e.g., tungsten) in the cavities 160B, 160C and above the nano-sheet fins 145A, 145B, 145C, 145D. A recess etch process was performed to remove portions of the conductive material positioned outside the cavities 160B, 160C. An upper surface 175U of the conductive interconnect 175 is positioned below an upper surface 115U of the semiconductor layer 115. The conductive interconnect 175 includes a vertical portion 175V positioned in the cavity 160B and lateral portions 175L extending laterally between the semiconductor layer 115 and the substrate 105 in the cavities 160C. The conductive interconnect has a T-shaped vertical cross-section. The portions of the conductive interconnect 175 positioned between the substrate 105 and the semiconductor layer 115 increase the cross-sectional area of the conductive interconnect, resulting in an increased volume of conductive material along the axial length of the conductive interconnect 175. This increased volume reduces the resistance of the conductive interconnect 175 and increases its current-carrying capacity.

Figure 1J:
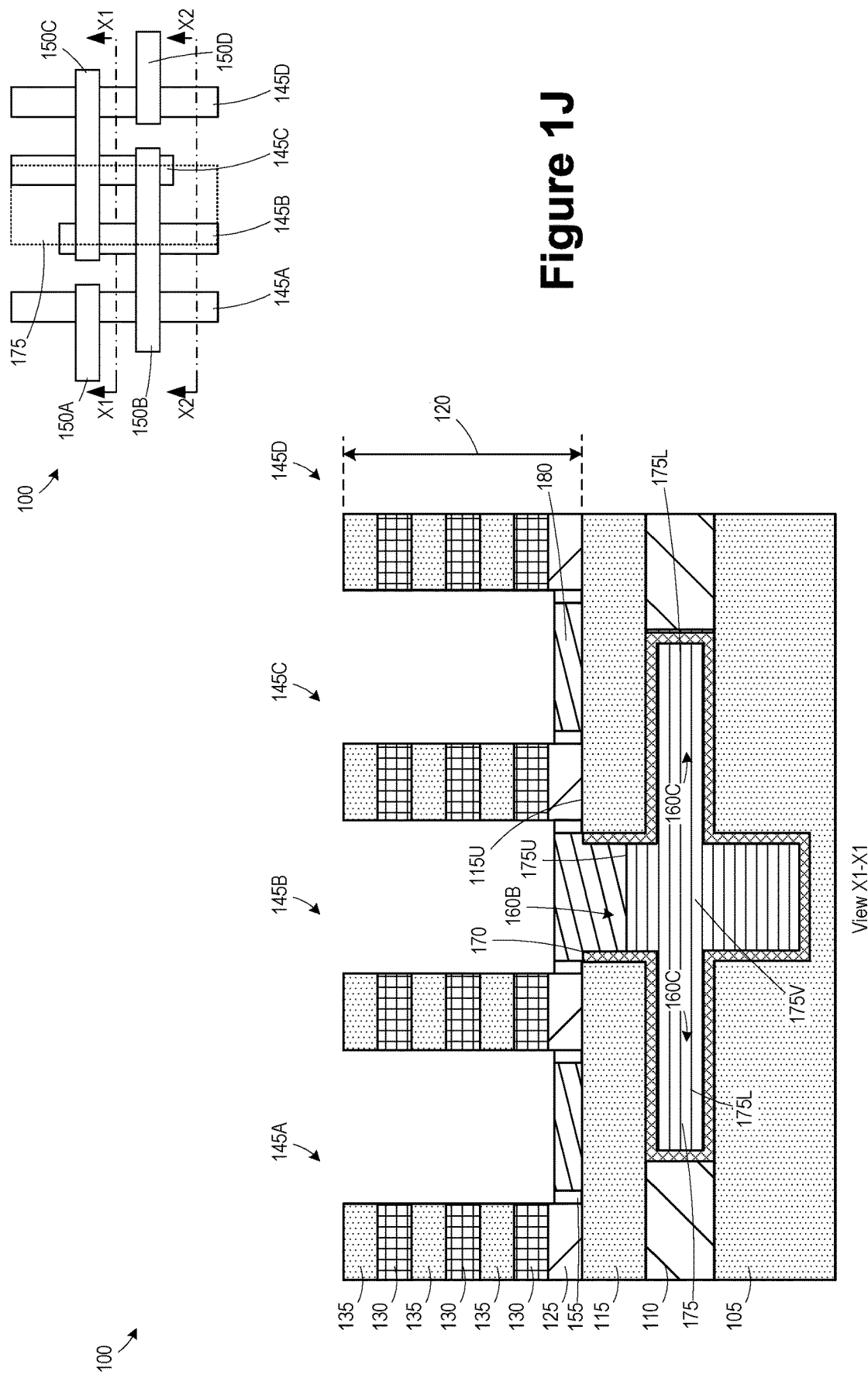

FIG. 1J illustrates the product 100 after several processes were performed to form an isolation structure 180 (e.g., silicon dioxide) in the cavity 160B and between the nano-sheet fins 145A, 145B, 145C, 145D. The hard mask layer 140 was removed. The isolation structure 180 was formed by depositing a dielectric material in the cavity 160B and above the nano-sheet fins 145A, 145B, 145C, 145D. A recess etch process was performed to remove portions of the dielectric material and the liner layer 155 to expose the nano-sheet fins 145A, 145B, 145C, 145D.

Figure 1K:
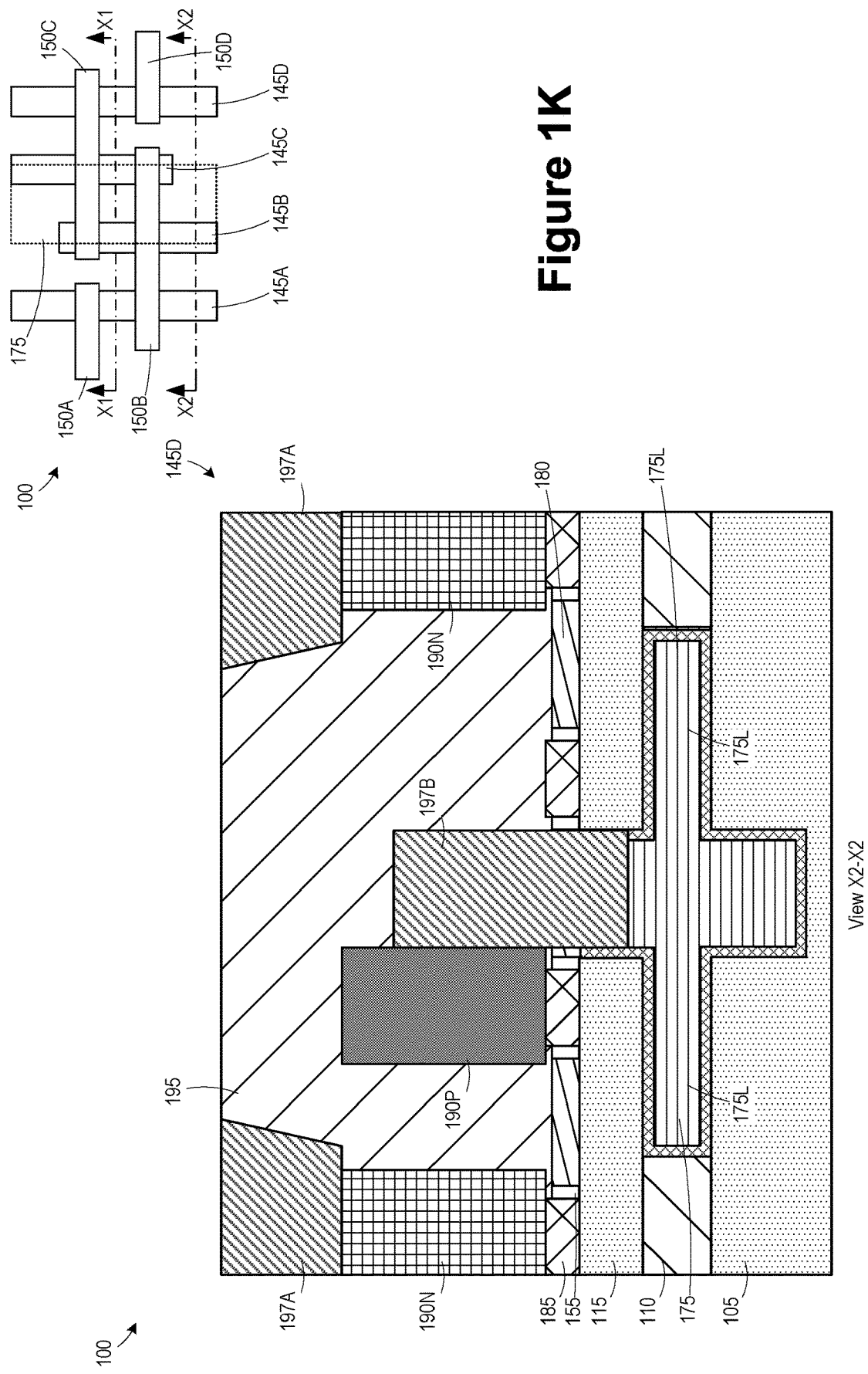

FIG. 1K illustrates the product 100 in view X2-X2 through source/drain regions of the nano-sheet fins 145A, 145B, 145C, 145D. Several processes were performed to complete fabrication of the product 100. The bottom sacrificial layer 125 was selectively removed and replaced with a dielectric material 185 (e.g., silicon nitride). Processes were performed to recess the portions of the nano-sheet fins 145A, 145B, 145C, 145D not covered by the gate structures 150A-150D and form N-type source drain regions 190N and P-type source/drain regions 190P. The gate structures 150A-150D were replaced with replacement gate materials, such as a high-k gate dielectric layer and a metal gate electrode. For example, the material of the gate structures 150A-150D was removed to define gate cavities, portions of the intermediate sacrificial layers 130 in the gate cavities were removed, and the replacement gate structures were formed in the gate cavities and around the channel semiconductor layers 135. A dielectric layer 195 was formed above the nano-sheet fins 145A, 145B, 145C, 145D and the gate structures 150A-150D, and contacts 197A, 197B, were formed in the dielectric layer 195. The contacts 197A contact the N-type source/drain regions 190N. The contact 197B contacts the P-type source/drain regions 190P and the conductive interconnect 175. In some embodiments, the contact 197B is recessed, as illustrated in FIG. 1K.

Figure 1L:
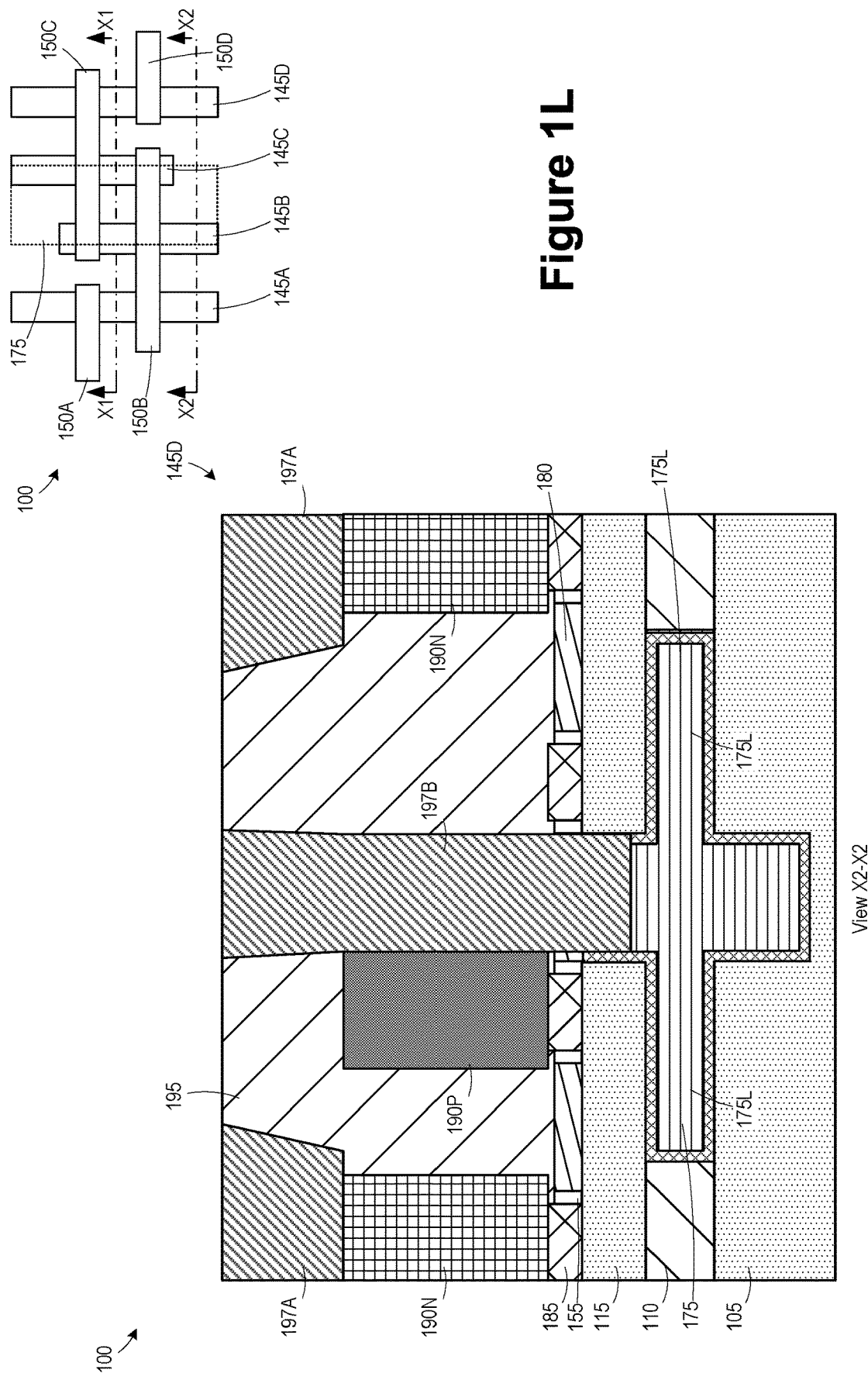

FIG. 1L illustrates an alternative embodiment of the product 100, according to some embodiments where the contact 197B is not recessed. The contacts 197A, 197B in this embodiment have coplanar upper surfaces.

FIGS. 2A-2I are various views that depict methods for forming buried local interconnects and the resulting integrated circuit product 200. In some embodiments, the product 200 includes vertically stacked nano-sheet devices. The product 200 is be formed in and above a semiconductor substrate 105. The product 200 is similar to the product 100 of FIG. 1B with the exception that the sacrificial layer 110 and the semiconductor layer 115 are omitted. Although the illustrated example depicts nano-sheet fins 145A, 145B, 145C, 145D, the techniques described herein may also be applied to semiconductor fins in some embodiments.

The drawings include a simplistic plan view of the product 200 indicating where various cross-sectional views "X1-X1" and "X2-X2" are taken. However, no attempt will be made to show the various steps depicted in the cross-sectional views in the drawings in the plan view of the product 200.

Figure 2A:
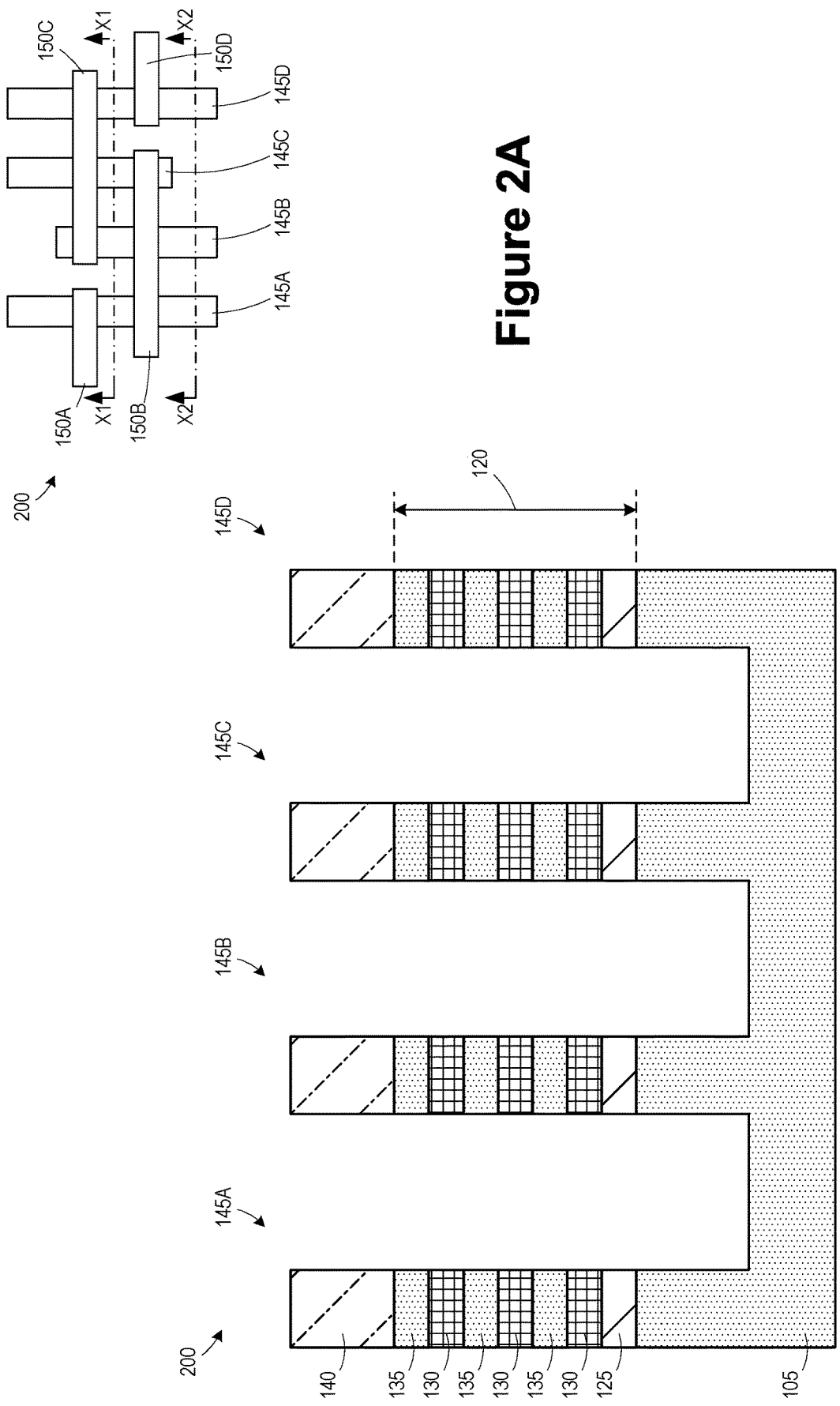
FIGS. 2A-2I are various views that depict methods for forming buried local interconnects and the resulting devices.
Figure 2B:
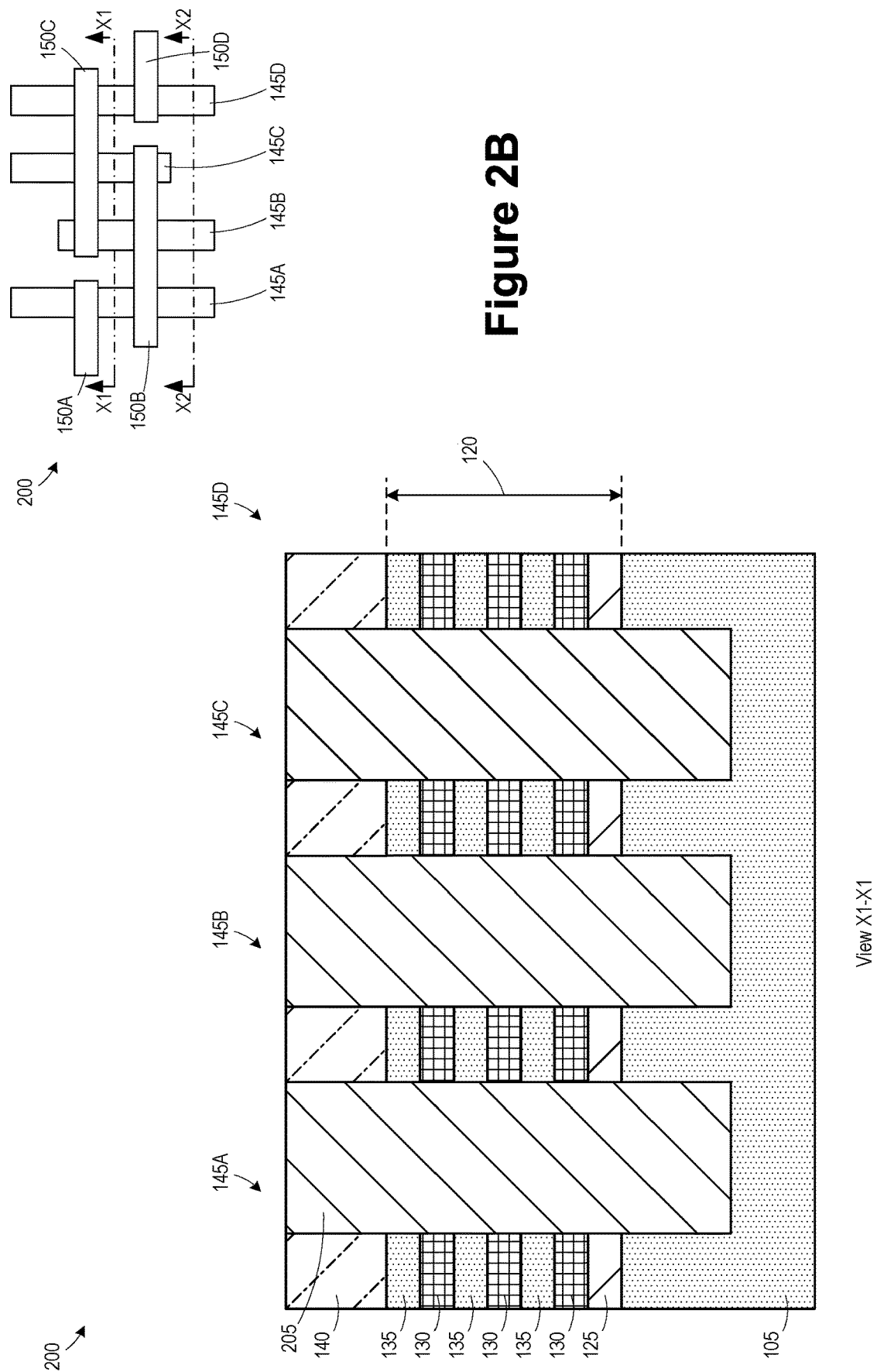

FIG. 2B illustrates the product 200 after a dielectric layer 205 was formed between the nano-sheet fins 145A, 145B, 145C, 145D, and a planarization process was performed to expose the hard mask layer 140.

Figure 2C:
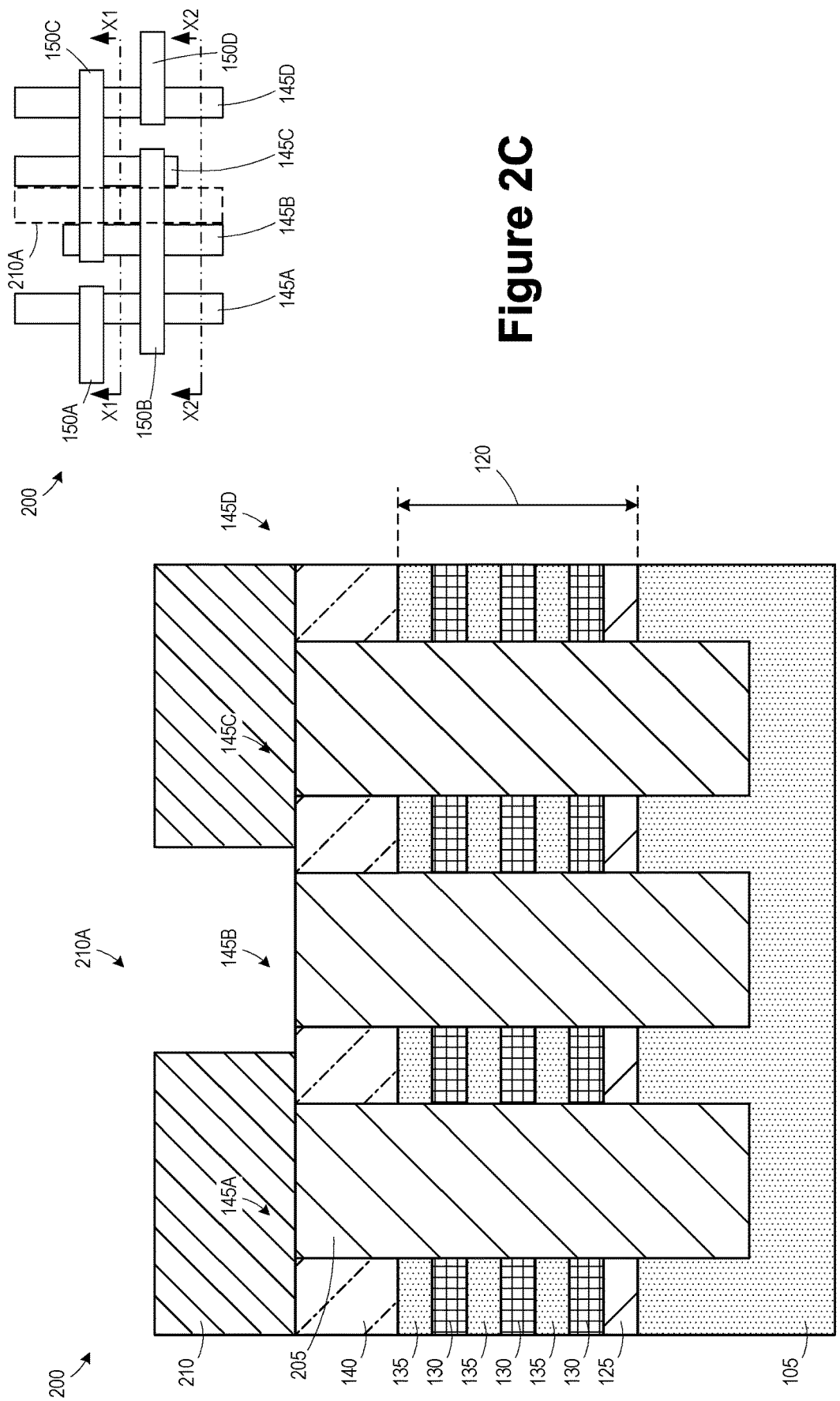

FIG. 2C illustrates the product 200 after a patterned etch mask 210, e.g., a patterned organic patterning layer (OPL) or photoresist, was formed on the product 200 by performing traditional manufacturing techniques. The patterned etch mask 210 includes an opening 210A located between the nano-sheet fins 145B, 145C. As described more fully below, the opening 205A is positioned at a location where it is desired to form a buried interconnect, such as a buried power rail.

Figure 2D:
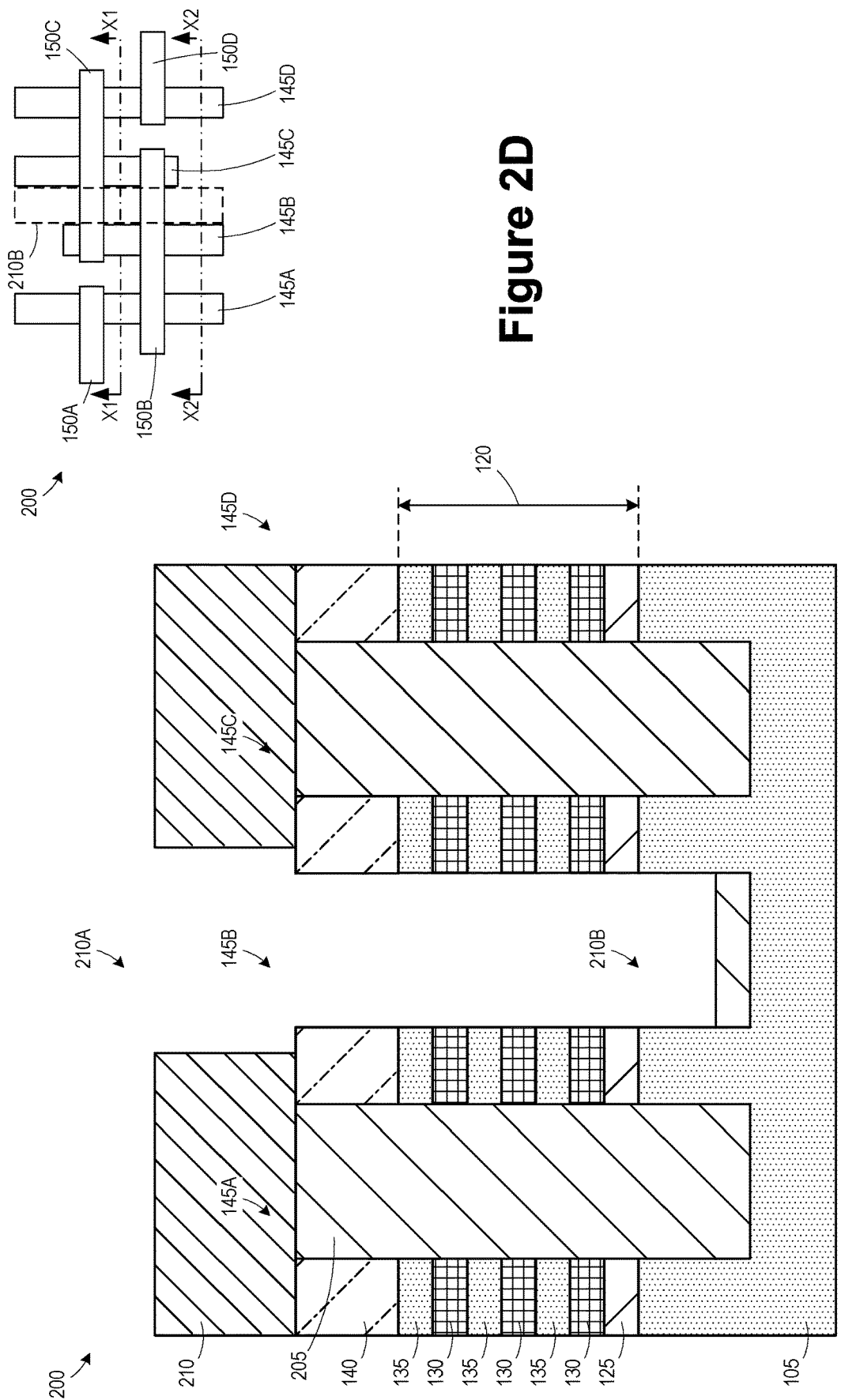

FIG. 2D illustrates the product 200 after one or more etch processes were performed using the patterned etch mask 210 to remove a portion of the dielectric layer 205 exposed by the opening 210A to define a trench 210B in the dielectric layer 205. The trench 210B exposes sidewall surfaces of the nano-sheet fins 145B, 145C and a portion of the sidewall surface of the substrate 105.

Figure 2E:
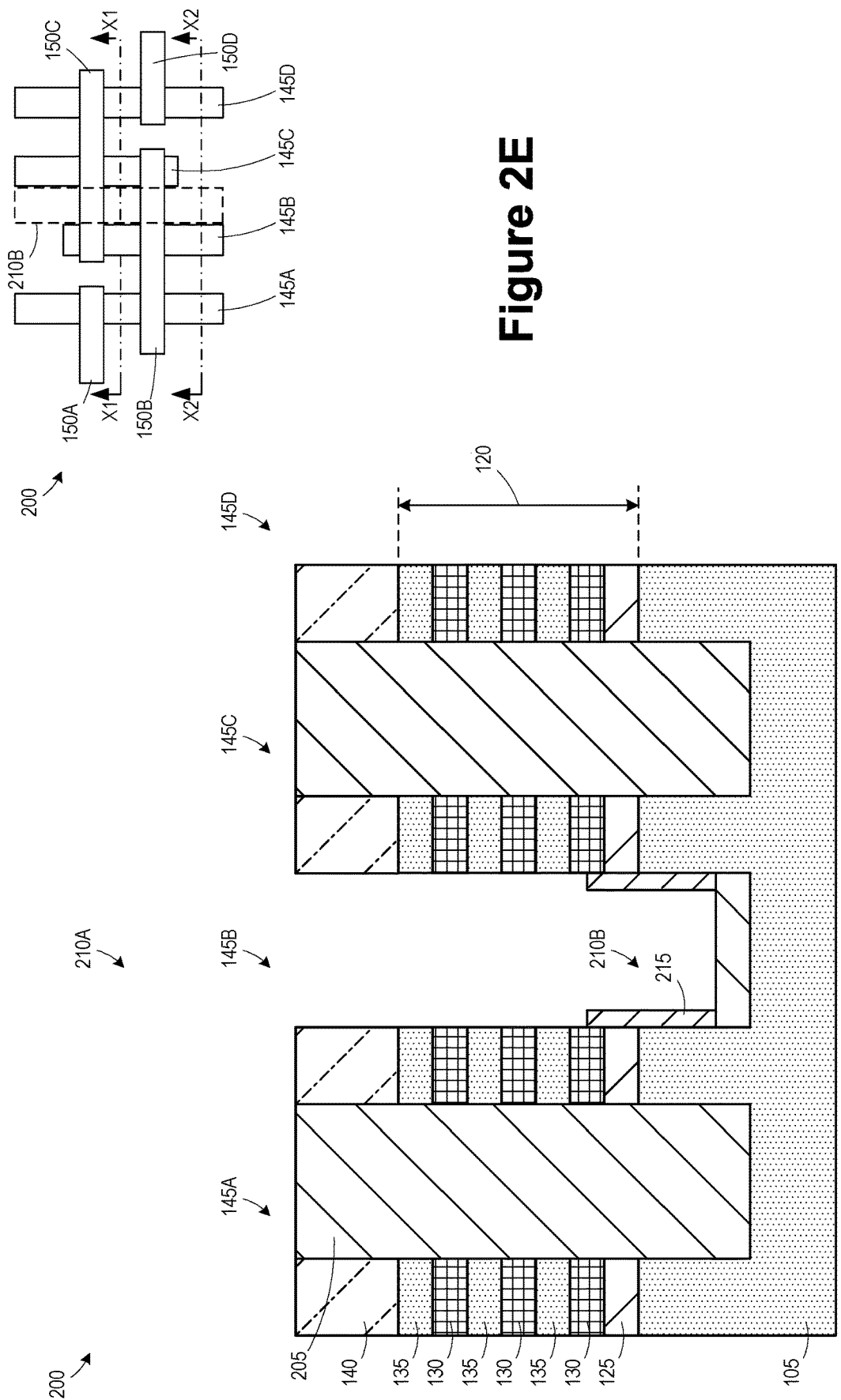

FIG. 2E illustrates the product 200 after the patterned etch mask 210 was removed and a spacer 215 was formed in the trench 210B. In some embodiments, the spacer 215 was formed by depositing a conformal layer of spacer material (e.g., SiC or SiOC) above the nano-sheet fins 145A-145D, above the dielectric layer 205, and in the trench 210B and performing an isotropic etch process to remove horizontal portions of the conformal layer of spacer material. Note that the spacer 215 covers exposed portions of the sacrificial layer 125 and a portion of the exposed sidewall of the lowermost sacrificial layer 130.

Figure 2F:
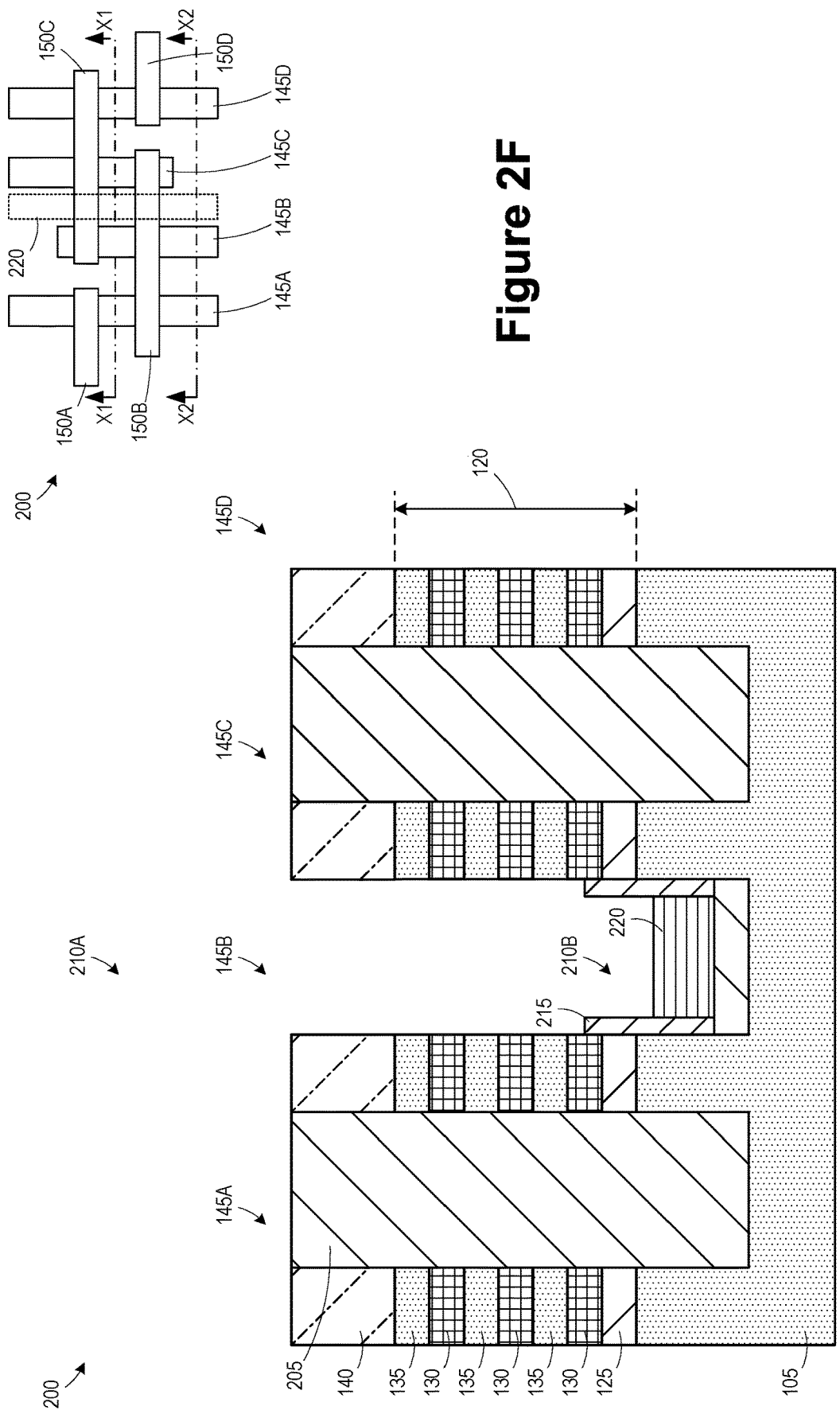

FIG. 2F illustrates the product 200 after several processes were performed to form a conductive interconnect 220 in the trench 210B. A deposition process was performed to form a conductive material (e.g., tungsten) in the trench 210B and above the dielectric layer 205. A recess etch process was performed to remove portions of the conductive material positioned outside the trench 210B.

Figure 2G:
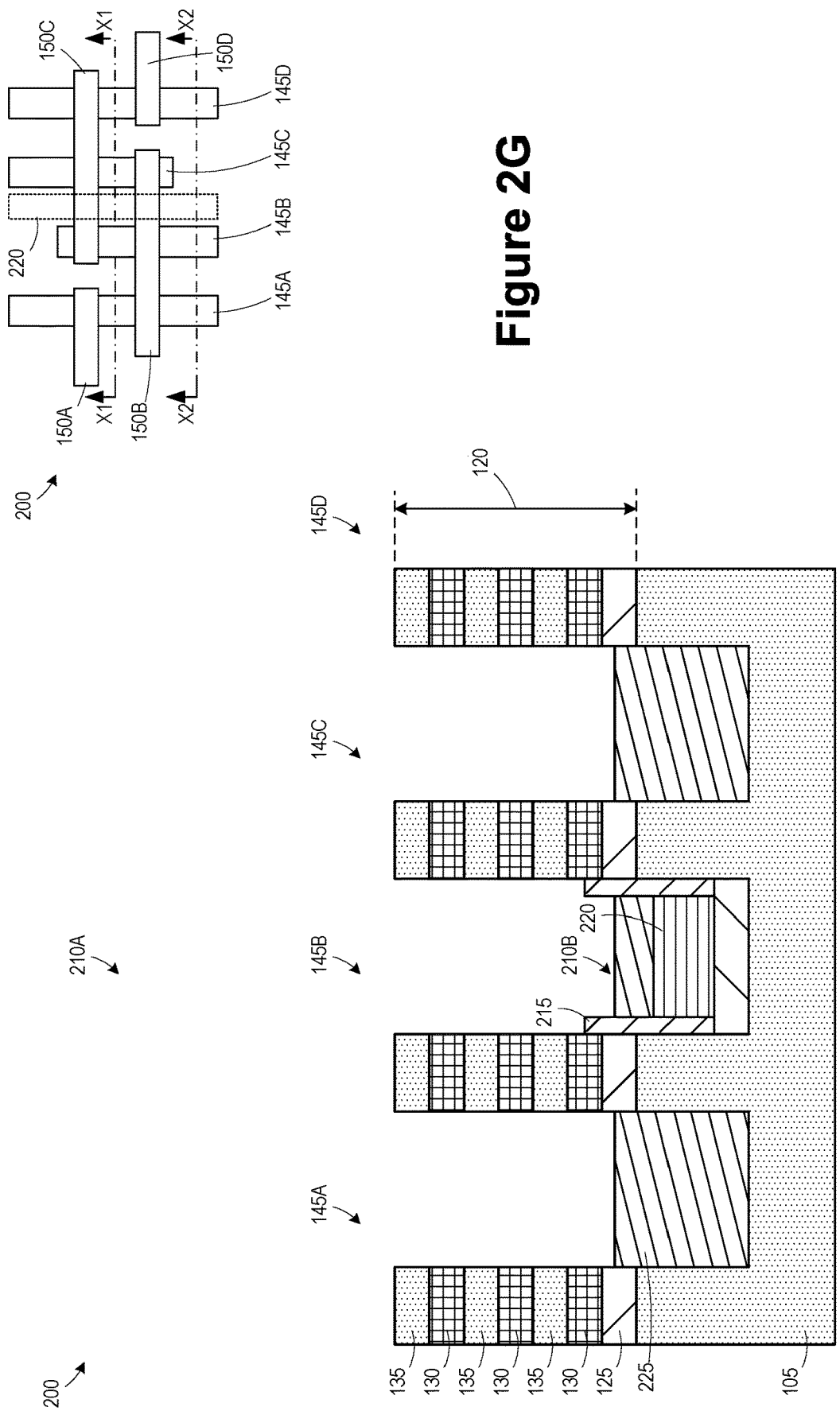

FIG. 2G illustrates the product 200 after several processes were performed to form an isolation structure 225 (e.g., silicon dioxide) in the trench 210B and between the nano-sheet fins 145A, 145B, 145C, 145D. The isolation structure 225 was formed by depositing a dielectric material in the trench 210B and above the nano-sheet fins 145A, 145B, 145C, 145D. A planarization process was performed to expose the hard mask layer 140. A recess etch process was performed to remove portions of the dielectric material 205 to expose the nano-sheet fins 145A, 145B, 145C, 145D. The hard mask layer 140 was removed.

Figure 2H:
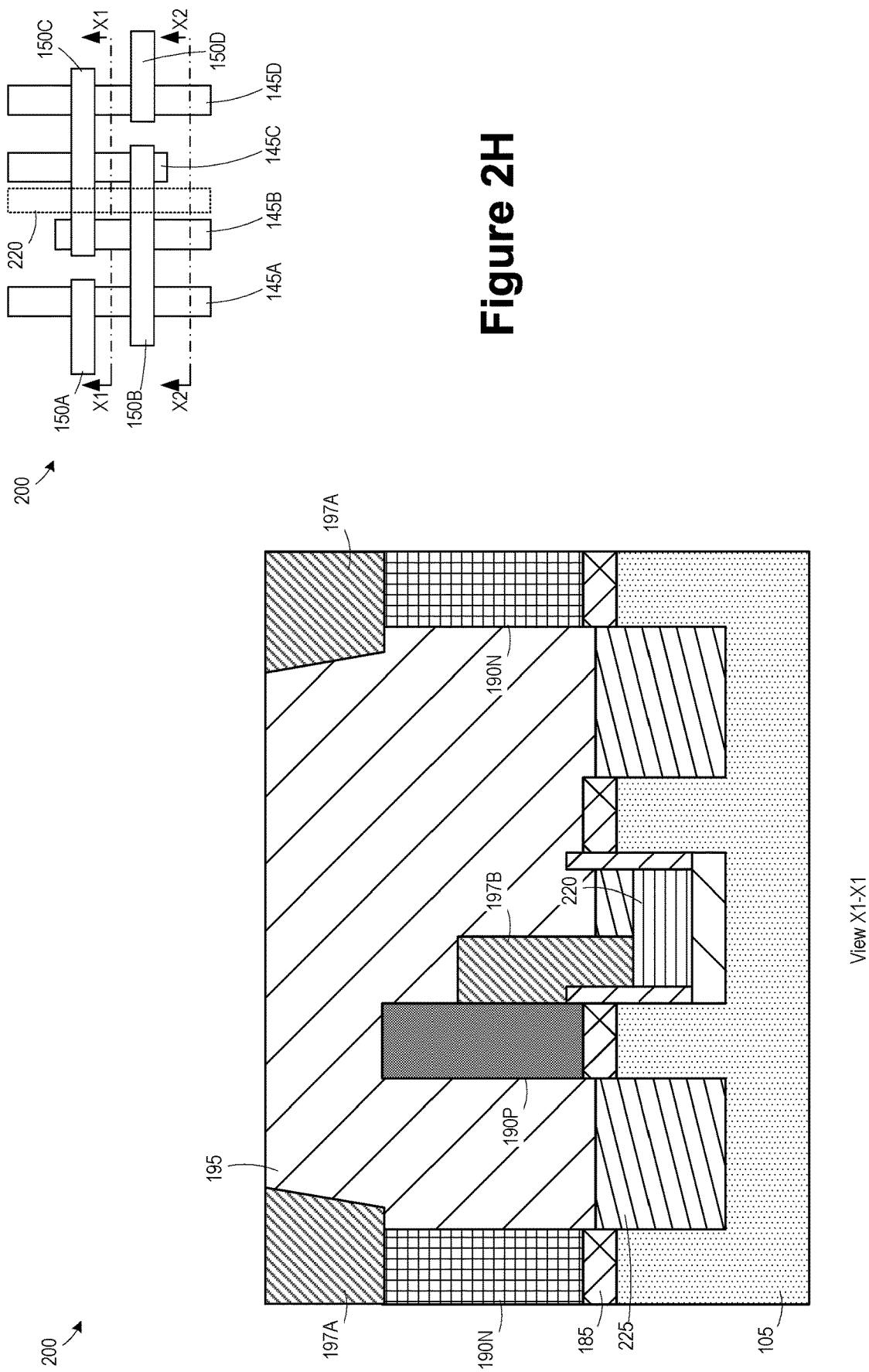

FIG. 2H illustrates the product 200 in view X2-X2 through source/drain regions of the nano-sheet fins 145A, 145B, 145C, 145D. Several processes were performed to complete fabrication of the product 200. The bottom sacrificial layer 125 was selectively removed and replaced with a dielectric material 185 (e.g., silicon nitride). Processes were performed to recess the portions of the nano-sheet fins 145A, 145B, 145C, 145D not covered by the gate structures 150A-150D and form N-type source/drain regions 190N and P-type source/drain regions 190P. The gate structures 150A-150D were replaced with replacement gate materials, such as a high-k gate dielectric layer and a metal gate electrode. For example, the material of the gate structures 150A-150D was removed to define gate cavities, portions of the intermediate sacrificial layers 130 in the gate cavities were removed, and the replacement gate structures were formed in the gate cavities and around the channel semiconductor layers 135. A dielectric layer 195 was formed above the nano-sheet fins 145A, 145B, 145C, 145D and the gate structures 150A-150D, and contacts 197A, 197B, were formed in the dielectric layer 195. The contacts 197A contact the N-type source/drain regions 190N. The contact 197B contacts the P-type source/drain regions 190P and the conductive interconnect 220. In some embodiments, the contact 197B is recessed, as illustrated in FIG. 2H.

Figure 2I:
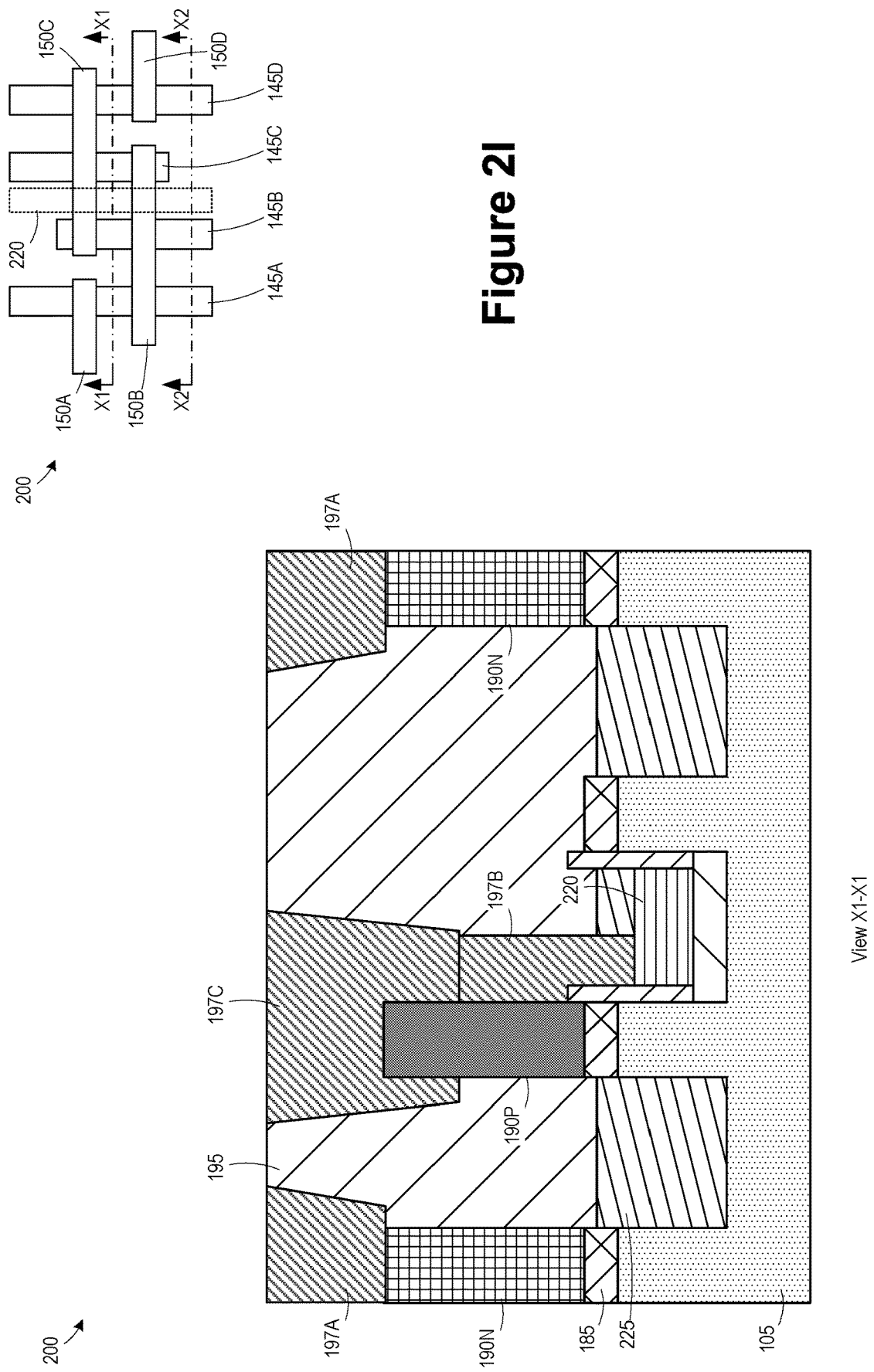

FIG. 2I illustrates the product 200, where an additional contact 197C was formed to contact the contact 197B, in accordance with some embodiments.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A device, comprising:
   a first semiconductor layer;
   a second semiconductor layer positioned above the first semiconductor layer;
   a first fin structure and a second fin structure positioned above the second semiconductor layer; and
   a conductive interconnect positioned in the first semiconductor layer, wherein at least a first portion of the conductive interconnect extends laterally under at least a portion of the first fin structure and a second portion of the conductive interconnect extends laterally under at least a portion of the second fin structure and wherein the first and second portions of the conductive interconnect are positioned between the first semiconductor layer and the second semiconductor layer.

2. The device of claim 1, further comprising a dielectric liner positioned between the conductive interconnect and the first semiconductor layer and between the conductive interconnect and the second semiconductor layer.

3. The device of claim 1, wherein an upper surface of the conductive interconnect is positioned at a level that is below a level of an upper surface of the second semiconductor layer.

4. The device of claim 1, further comprising a contact positioned between the first and second fin structures and contacting the conductive interconnect.

5. The device of claim 1, wherein the conductive interconnect has a T-shaped vertical cross-section.

6. The device of claim 1, wherein the first fin structure comprises a first source/drain region, the second fin structure comprises a second source/drain region, and the device further comprises:
   a first contact contacting the first source/drain region and the conductive interconnect; and
   a second contact contacting the second source/drain region.

7. A device, comprising:
   a first semiconductor layer;
   a second semiconductor layer positioned above the first semiconductor layer;
   a first fin structure and a second fin structure positioned above the second semiconductor layer, wherein the first fin structure comprises a first source/drain region;
   a conductive interconnect positioned in the first semiconductor layer and having a T-shaped vertical cross-section, wherein first and second portions of the conductive interconnect are positioned between the first semiconductor layer and the second semiconductor layer; and
   a first contact contacting the first source/drain region and the conductive interconnect.

8. The device of claim 7, wherein the second fin structure comprises a second source/drain region, and the device further comprises a second contact contacting the second source/drain region.

9. The device of claim 7, wherein the first portion of the conductive interconnect extends laterally under at least a portion of the first fin structure and the second portion of the conductive interconnect extends laterally under at least a portion of the second fin structure.

10. A device, comprising:
   a first fin structure and a second fin structure positioned above a first semiconductor layer;
   a conductive interconnect positioned in the first semiconductor layer, wherein at least a first portion of the conductive interconnect extends laterally under at least a portion of the first fin structure and a second portion of the conductive interconnect extends laterally under at least a portion of the second fin structure, wherein the conductive interconnect has a T-shaped vertical cross-section;
   a dielectric liner positioned between the conductive interconnect and the first semiconductor layer;
   a contact positioned between the first and second fin structures and contacting the conductive interconnect; and
   an isolation structure positioned on an upper surface of the conductive interconnect, wherein the contact positioned between the first and second fin structures that contacts the conductive interconnect extends through a portion of the isolation structure.

11. The device of claim 10, wherein an upper surface of the conductive interconnect is positioned at a level that is below a level of an upper surface of the second semiconductor layer.

12. The device of claim 10, wherein the first fin structure comprises a first source/drain region, the second fin structure comprises a second source/drain region, and the device further comprises:
- a first contact contacting the first source/drain region and the conductive interconnect; and
- a second contact contacting the second source/drain region.

13. The device of claim 10, wherein the first semiconductor layer comprises a second semiconductor layer, a third semiconductor layer positioned above the second semiconductor layer, and a fourth semiconductor layer positioned above the third semiconductor layer, a first portion of the conductive interconnect extends laterally under at least a portion of the first fin structure between the second semiconductor layer and the fourth semiconductor layer, a second portion of the conductive interconnect extends laterally under at least a portion of the second fin structure between the second semiconductor layer and the fourth semiconductor layer, wherein the first and second portions of the conductive interconnect are positioned adjacent the third semiconductor layer.

14. The device of claim 13, wherein a material of the fourth semiconductor layer differs from materials of the second semiconductor layer and the third semiconductor layer.

15. The device of claim 10, further comprising an isolation structure positioned on an upper surface of the conductive interconnect.

16. The device of claim 10, wherein the first semiconductor layer comprises silicon.

* * * * *